(12) United States Patent
Shiraishi et al.

(10) Patent No.: US 7,850,803 B2
(45) Date of Patent: Dec. 14, 2010

(54) METHOD FOR CONNECTING ELECTRONIC COMPONENTS, METHOD FOR FORMING BUMP AND CONDUCTIVE CONNECTION FILM AND FABRICATION APPARATUS FOR ELECTRONIC COMPONENT MOUNTED BODY, BUMP AND CONDUCTIVE CORRECTION FILM

(75) Inventors: Tsukasa Shiraishi, Osaka (JP); Seiichi Nakatani, Osaka (JP)

(73) Assignee: Panasonic Corporation, Osaka (JP)

( * ) Notice: Subject to any disclaimer, the term of this patent is extended or adjusted under 35 U.S.C. 154(b) by 801 days.

(21) Appl. No.: 11/783,750

(22) Filed: Apr. 11, 2007

(65) Prior Publication Data

US 2008/0011402 A1 Jan. 17, 2008

(30) Foreign Application Priority Data

Apr. 19, 2006 (JP) .............................. 2006-115248

(51) Int. Cl.
*B32B 37/00* (2006.01)
(52) U.S. Cl. ................................. 156/73.1; 210/748.02
(58) Field of Classification Search ................ 156/73.1, 156/580.1, 580.2; 228/1.1, 110.1; 264/442, 264/443, 444, 445; 210/748.01, 748.02; 73/570.5
See application file for complete search history.

(56) References Cited

U.S. PATENT DOCUMENTS 6,216,538 B1 * 4/2001 Yasuda et al. .............. 73/570.5

FOREIGN PATENT DOCUMENTS

| JP | 9-193055 A | 7/1997 |
| JP | 2002-151549 A | 5/2002 |

* cited by examiner

*Primary Examiner*—James Sells
(74) *Attorney, Agent, or Firm*—McDermott Will & Emery LLP

(57) ABSTRACT

A liquid resin in which conductive particles are dispersed is supplied to between a circuit substrate and a semiconductor chip disposed so as to face each other and an ultrasonic wave having an amplitude in a perpendicular direction to a surface of the circuit substrate to generate a standing wave in a resin. Then, the conductive particles dispersed in the resin are captured at nodes of the standing wave to form connection bodies of aggregation of the conductive particles between connection terminals of the semiconductor chip and terminals of the circuit substrate. Thus, the semiconductor chip is mounted on the circuit substrate via the connection bodies. The terminals are arrayed so as to be spaced apart from one another by half a wavelength of the standing wave and each of the nodes of the standing wave are generated at a position between the terminals in the resin.

19 Claims, 11 Drawing Sheets

METHOD FOR CONNECTING ELECTRONIC COMPONENTS, METHOD FOR FORMING BUMP AND CONDUCTIVE CONNECTION FILM AND FABRICATION APPARATUS FOR ELECTRONIC COMPONENT MOUNTED BODY, BUMP AND CONDUCTIVE CORRECTION FILM

BACKGROUND OF THE INVENTION

1. Field of the Invention

The present invention relates to a method for connecting electronic components as well as mounting a semiconductor chip, a method for forming bumps on terminals of a substrate and a method for forming a conductive connection film for connecting electronic components. The present invention also relates to fabrication apparatuses for forming an electronic component mounted body, bumps, and a conductive connection film.

2. Description of the Prior Art

Currently, electronic component mounted bodies are utilized in various electronics devices. Therefore, the improvement of performance, quality and reliability of electronic component mounted bodies contributes to the improvement of performance, quality and reliability of electronic devices.

In recent years, as the degree of integration of LSIs has been increased, the number of pins of connection terminals has been increased and a pitch between pins of connection terminals has been reduced. With such a technical background, as a technique for mounting an LSI on a circuit substrate, flip-chip bonding has been used.

Flip-chip bonding is a technique in which connection terminals of a semiconductor chip and electrode terminals of a circuit substrate are connected via solder bumps, respectively. In flip-chip bonding, after forming solder bumps on connection terminals of a semiconductor chip by plating, the semiconductor chip is disposed on a circuit substrate with an upper surface of the semiconductor chip facing down and the solder bumps are reflowed to create electrical connection between terminals. This technique allows formation of electrical connections between a semiconductor chip and a circuit substrate in a batch manner, and therefore, is suitable for mounting an LSI with increased number of pins and reduced pitch between pins.

However, to connect terminals via solder bumps, solder bumps are reflowed and thus a circuit substrate has to be heated to a high temperature. To avoid heating a circuit substrate, as a technique which does not require high temperature heating for reflow, there has been used a flip-chip mounting technique using a conductive adhesive. In this technique, after forming gold bumps on connection terminals of a semiconductor chip by wire bonding and transferring a conductive adhesive onto the gold bumps, a semiconductor chip is disposed on a circuit substrate with an upper surface of the semiconductor chip facing down and the conductive adhesive is hardened to create connection between terminals. However, according to this technique, gold bumps are formed by wire bonding and thus the gold bumps can not be formed in a batch manner. Therefore, in terms of formation of an increased number of pins, productivity is reduced.

A technique for mounting a semiconductor chip on a circuit substrate without providing the foregoing solder bumps or gold bumps therebetween has been disclosed in Japanese Laid-Open Publication No. 2002-151549. FIG. 11A and FIG. 11B are cross-sectional views illustrating respective steps of this technique. First, as shown in FIG. 11A, through holes are formed in a film base material 101. Then, a metal material 102 such as Cu and the like is deposited in the through holes. Thereafter, bump portions 103 are formed by plating or the like on surfaces of the metal material 102, i.e., conductive path surfaces 102 which are exposed at both upper and lower surfaces of the film base material 101 so as to include a solder layer. Then, as shown in FIG. 11B, the film base material 101 including the conductive path surfaces 102 and the bump portions 103 formed therein is interposed between a semiconductor chip 110 and a circuit substrate 111 and then the solder layer is fused by heat, thereby connecting the bump portions 103 to connection terminals 112 of the semiconductor chip 110 and electrode terminals 113 of the circuit substrate 111. Thus, the semiconductor chip 110 is mounted on the circuit substrate 111.

SUMMARY OF THE INVENTION

The above-described known mounting methods are all for connecting terminals of a semiconductor chip to terminals of a circuit substrate via solder bumps, gold bumps or bumps and thus need to include the step of forming these connection members. Therefore, not only productivity of the known methods is low but also an expensive apparatus such as a plating apparatus or the like is needed for forming these connection members, so that production costs are increased. Moreover, these connection members have to be formed so as to be aligned with connection positions of terminals and the like of a semiconductor chip. Accordingly, an apparatus for highly precise position alignment is needed, so that production costs are increased and reduction in pitch is limited.

In view of the above-described points, the present invention has been devised. Therefore, it is a major object of the present invention to provide a method for connecting electronic components, a method for mounting a semiconductor chip and a method for forming bumps with high productivity, low costs, high performance, high quality and high reliability.

A method for connecting electronic components according to the present invention is a method for connecting electronic components, in which electronic components each having a plurality of terminals are disposed so as to face each other to create electrical connection between ones of the terminals facing each other via an associated one of connection bodies and is characterized in that the method includes the steps of: supplying a liquid material in which conductive particles are dispersed to between the electronic components disposed to face each other; and entering an ultrasonic wave having an amplitude in a perpendicular direction to surfaces of the electronic components to generate a standing wave in the liquid material, and the conductive particles dispersed in the liquid material are captured by nodes of the standing wave generated in the liquid material to form the connection bodies of aggregation of the conductive particles between the terminals.

According to this method, by entering an ultrasonic wave in a liquid material in which conductive particles are dispersed to generate a standing wave, connection bodies of aggregation of conductive particles can be formed between terminals of electronic components in a batch manner. Thus, connection between the electronic components can be achieved in a simple manner, so that connection bodies for electronic components with high productivity and low costs can be achieved. Moreover, by changing a frequency or phase of an ultrasonic wave to be entered in a liquid material, nodes of a standing wave, i.e., positions where conductive particles are to be captured can be adjusted. Thus, highly precise position alignment for forming connection bodies is unnecessary and connection for electronic components including terminals, even if pitches of the terminals are different between the electric components, can be flexibly performed. Therefore, connection bodies for electronic components with high productivity and reliability can be achieved.

In this method, it is preferable that each of the nodes of the standing wave is generated in a position between ones of the terminals facing each other in the liquid material. Moreover, it is preferable that the plurality of terminals formed on the electronic components are arrayed so as to be spaced apart from one another by half a wavelength of the standing wave. As another option, the plurality of terminals formed on the electronic components may be arrayed to be spaced apart from one another by ¼ of a wavelength of the standing wave, and the step of entering the ultrasonic wave to generate the standing wave may include two separate incidences of ultrasonic waves having different phases from each other by ¼ of a wavelength of the standing wave.

In one preferred embodiment, the method further includes the step of heating the liquid material to fuse the aggregated conductive particles between the terminals. Thus, connection bodies in a stable conduction state can be formed.

In one preferred embodiment, the method further includes the step of hardening the liquid material after formation of the connection bodies between the terminals. Thus, a stable connection state between terminals can be kept. In executing this process step, the liquid material is preferably formed of thermoset resin. Moreover, the conductive particles are preferably formed of solder powder.

A method for mounting a semiconductor chip according to the present invention is a method for mounting a semiconductor chip, in which a semiconductor chip including a plurality of connection terminals is disposed so as to face a circuit substrate including a plurality of electrode terminals and the connection terminals are connected to the electrode terminals via connection bodies, respectively, and is characterized in that the method includes the steps of: supplying a resin in which conductive particles are dispersed to between the circuit substrate and the semiconductor chip disposed to face each other; and entering an ultrasonic wave having an amplitude in a perpendicular direction to respective surfaces of the circuit substrate and the semiconductor chip to generate a standing wave in the resin, and the conductive particles dispersed in the resin are captured by nodes of the standing wave generated in the resin to form the connection bodies of aggregation of the conductive particles.

According to this method, by entering an ultrasonic wave in a resin in which conductive particles are dispersed to generate a standing wave, connection bodies of aggregation of conductive particles can be formed between each of electrode terminals of and an associated one of connection terminals in a batch manner. Thus, connection between the terminals can be achieved in a simple manner, so that a semiconductor chip mounted body with high productivity at low costs can be achieved. Moreover, by changing a frequency or phase of an ultrasonic wave to be entered in a resin, nodes of a standing wave, i.e., positions where conductive particles are to be captured can be adjusted. Thus, highly precise position alignment for forming connection bodies is unnecessary and a semiconductor chip including terminals, even if pitches of the terminals are different between the electric components, can be flexibly handled. Therefore, a semiconductor chip mounted body with high productivity and reliability can be achieved.

In this method, it is preferable that each of the nodes of the standing wave is generated in a position between each of the electrode terminals and an associated one of the connection terminals facing each other in the liquid material. Moreover, it is preferable that the electrode terminals and the connection terminals are arrayed so as to be spaced apart from one another by half a wavelength of the standing wave. As another alternative, the electrode terminals and the connection terminals may be arrayed to be spaced apart from one another by ¼ of a wavelength of the standing wave, and the step of entering the ultrasonic wave to generate the standing wave may include two separate incidences of ultrasonic waves having different phases from each other by ¼ of a wavelength of the standing wave.

In one preferred embodiment, the method further includes the steps of: heating the resin to fuse the aggregated conductive particles between the electrode terminals and the connection terminals and form connection bodies; and hardening the resin after formation of the connection bodies.

A method for forming bumps according to the present invention is a method for forming bumps on a plurality of terminals of a substrate and is characterized in that the method includes the steps of: supplying a liquid material in which conductive particles are dispersed to between the substrate and a flat plate disposed so as to face the substrate; entering an ultrasonic wave having an amplitude in a perpendicular direction to respective surfaces of the substrate and the flat plate to generate a standing wave, thereby forming the bumps of aggregation of the conductive particles on the terminals; and removing the flat plate after formation of the bumps.

According to this method, by entering an ultrasonic wave in a liquid material in which conductive particles are dispersed to generate a standing wave, bumps of aggregation of conductive particles can be formed on terminals in a batch manner. Thus, bumps can be formed on the terminals of a substrate in a simple manner, so that the substrate including bumps with high productivity and low costs can be achieved. Moreover, by changing a frequency or phase of an ultrasonic wave to be entered in a liquid material, nodes of a standing wave, i.e., positions where conductive particles are to be captured can be adjusted. Thus, highly precise position alignment for forming bumps is unnecessary and a substrate including terminals, even if pitches of the terminals are different between the electric components, can be flexibly handled. Therefore, a substrate including bumps with high productivity and reliability can be achieved.

In this method, it is preferable that each of the nodes of the standing wave is generated in a position corresponding to part between associated ones of the terminals in the liquid material. Moreover, it is preferable that the plurality of terminals are arrayed so as to be spaced apart from one another by half a wavelength of the standing wave. As another alternative, the plurality of terminals may be arrayed to be spaced apart from one another by ¼ of a wavelength of the standing wave, and the step of entering the ultrasonic wave to generate the standing wave may include two separate incidences of ultrasonic waves having different phases from each other by ¼ of a wavelength of the standing wave.

In one preferred embodiment, the method further includes the step of heating the liquid material to fuse the aggregated conductive particles on the terminals, thereby forming the bumps.

In one preferred embodiment, the method further includes the step of hardening the liquid material after formation of the bumps on the terminals. In this case, the liquid material is preferably formed of resin having adhesiveness.

A method for forming a conductive connection film according to the present invention is a method for forming a conductive connection film which includes a plurality of conductive members each passing through a resin film and is characterized in that the method includes the steps of: supplying a liquid resin in which conductive particles are dispersed to between flat plates disposed so as to face each other; entering an ultrasonic wave having an amplitude in a perpendicular direction to respective surfaces of the flat plates to generate a standing wave and capture the conductive particles dispersed in the liquid resin at nodes of the standing wave, thereby forming the conductive members of aggregation of the conductive particles in the liquid resin; hardening the liquid resin to form the liquid resin into a resin film; and removing the flat plates after formation of the resin film.

According to this method, by entering an ultrasonic wave in a liquid resin in which conductive particles are dispersed to generate a standing wave, conductive members of aggregation of conductive particles can be formed in the liquid resin in a batch manner. Thus, conductive members can be formed in a resin film in a simple manner, so that a conductive connection film with high productivity at low costs can be achieved. Moreover, by changing a frequency or phase of an ultrasonic wave to be entered in a liquid resin, nodes of a standing wave, i.e., positions where conductive particles are to be captured can be adjusted. Thus, electronic components including terminals, even if pitches of the terminals are different between the electric components, can be flexibly handled. Therefore, a conductive connection film with high productivity and reliability can be achieved.

According to the present invention, an ultrasonic wave is entered into a liquid material in which conductive particles are dispersed to generate a standing wave. Thus, connection bodies or bumps of aggregation of the conductive particles can be formed between terminals of electronic components or on terminals of a substrate in a batch manner. Accordingly, connection of the electronic components or formation of bumps on the terminals can be allowed in a simple manner. Therefore, an electronic component mounted body with high productivity at low costs can be achieved.

Moreover, a frequency or phase of an ultrasonic wave to be entered in a liquid material can be changed to adjust nodes of a standing wave, i.e., positions where conductive particles are to be captured. Thus, highly precise position alignment for forming connection bodies or bumps is unnecessary and connection of electronic components including terminals or formation of bumps on the terminals, even if pitches of the terminals are different between the electric components, can be flexibly performed. Therefore, an electronic component mounted body with high productivity and reliability can be achieved.

DESCRIPTION OF THE PREFERRED EMBODIMENTS

Figure 1A:
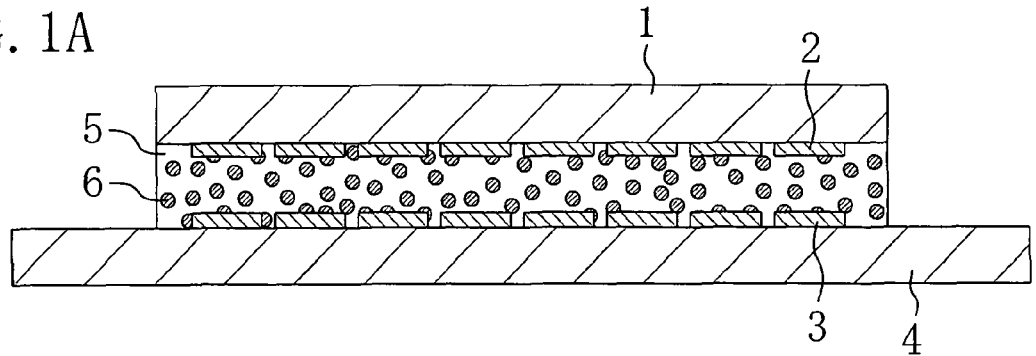
FIGS. 1A through 1D are cross-sectional views schematically illustrating respective steps for connecting electronic components according to a first embodiment of the present invention.

Hereafter, embodiments of the present invention will be described with reference to the accompanying drawings. In the accompanied drawings, components having substantially the same function are denoted by the same reference numeral for the purpose of simplicity. Note that the present invention is not limited to the following embodiments.

First Embodiment

FIGS. 1A through 1D are cross-sectional views schematically illustrating respective steps for connecting electronic components according to a first embodiment of the present invention. In this embodiment, an example where a semiconductor chip and a circuit substrate are used as electronic components will be described.

First, as shown in FIG. 1A, a semiconductor chip 1 and a circuit substrate 4 are held in parallel so that the semiconductor chip 1 and the circuit substrate 4 face each other and electrode pads (connection terminals) 2 formed on a semiconductor chip 1 and input/output terminals (electrode terminals) 3 formed on a circuit substrate 4 which are to be connected to the electrode pads 2 overlap, respectively, and a liquid material (for example, flux) 5 containing conductive particles (for example, soldering powder) 6 is filled between the semiconductor chip 1 and the circuit substrate 4.

Note that after applying the liquid material 5 onto the circuit substrate 4, the liquid material 5 may be supplied by making the semiconductor chip 1 abut to a surface of the liquid material 5.

Figure 1B:
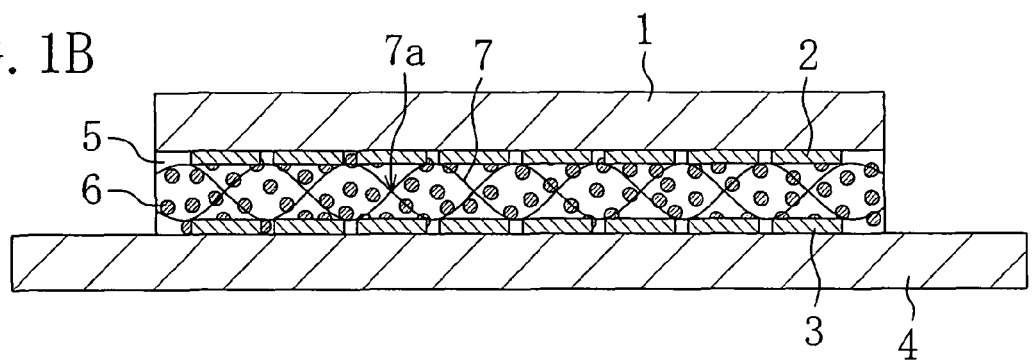
Figure 1C:
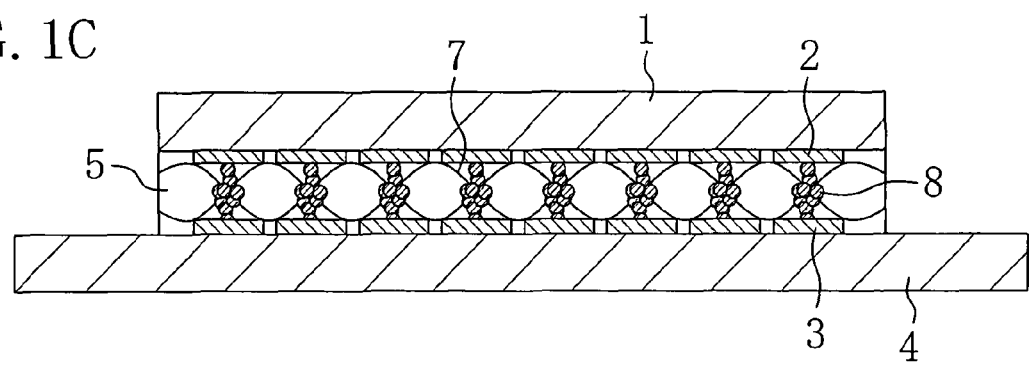

Next, as shown in FIG. 1B, an ultrasonic wave is entered into the liquid material 5 to generate a standing wave 7 so that its amplitude direction is perpendicular and its wave direction is parallel with respect to the semiconductor chip 1 and the circuit substrate 4. Accordingly, as shown in FIG. 1C, the conductive particles 6 are captured by nodes 7a of the standing wave 7 to form connection bodies 8 of aggregation of the conductive particles 6.

This method is based on the same principle as that used for a known method called "non-contact micromanipulation" in which using an ultrasonic wave, minute particles are handled without making contact with them. The mechanism for capture of the conductive particles 6 can be explained as follows (see, for example, Japanese Laid-Open Publication No. 9-193055).

Specifically, when a standing wave of a ultrasonic wave is generated in a fluid medium and sufficiently smaller minute particles than a wavelength of the standing wave are disposed, due to an acoustic radiation pressure generated around the minute particles, a force is applied to the minute particles toward mechanically stable positions (i.e., nodes in an acoustic distribution of the standing wave) spaced apart from one another by half a wavelength. Due to this action, the conductive particles 6 dispersed in the liquid material 5 are captured around the nodes of the standing wave to be aggregated at intervals of half a wavelength near nodes of the standing wave.

According to the principle, an interval between nodes and positions of nodes can be freely changed by changing an ultrasonic wave frequency and a phase at an ultrasonic wave radiating source. Therefore, in the present invention, the conductive particles 6 dispersed in the liquid material 5 can be aggregated together between the terminals 2 and 3 each of which is disposed in a predetermined position.

Figure 1D:
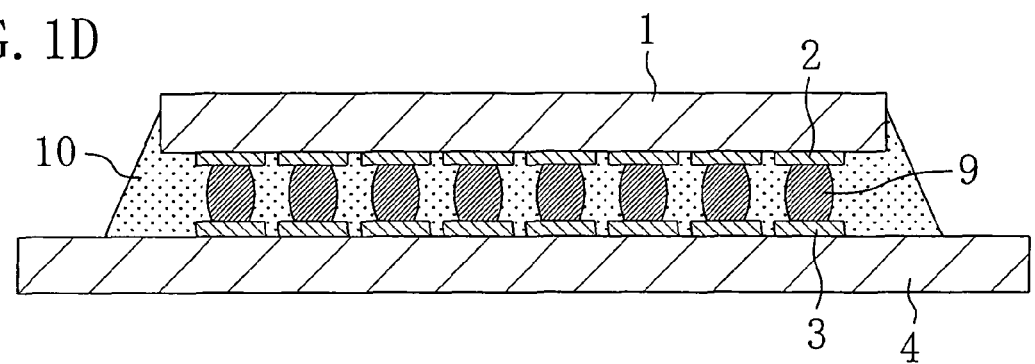

Furthermore, as shown in FIG. 1D, the conductive particles 6 aggregated at each node are fused by heating the liquid material 5 at high temperature to connect the connection terminals 2 of the semiconductor chip 1 and the electrode terminals 3 of the circuit substrate 4 via connection bodies 9, respectively. Thus, electronic component mounted bodies are formed. An encapsulant resin 10 is injected between the semiconductor chip 1 and the circuit substrate 4 and then is hardened as necessary, thereby reinforcing fixing of the semiconductor chip 1.

Note that as shown in FIG. 1B, the electrode pads 2 of the semiconductor chip 1 and the electrode terminals 3 of the circuit substrate 4 are arrayed to be spaced apart from one another by half a wavelength. Therefore, with a single incidence of ultrasonic wave, all the electrode pads 2 are connected to all the electrode terminals 3 via the connection bodies 9, respectively, in a batch manner. However, the electrode pads 2 and the electrode terminals 3 do not have to be connected in a batch manner.

Figure 2A:
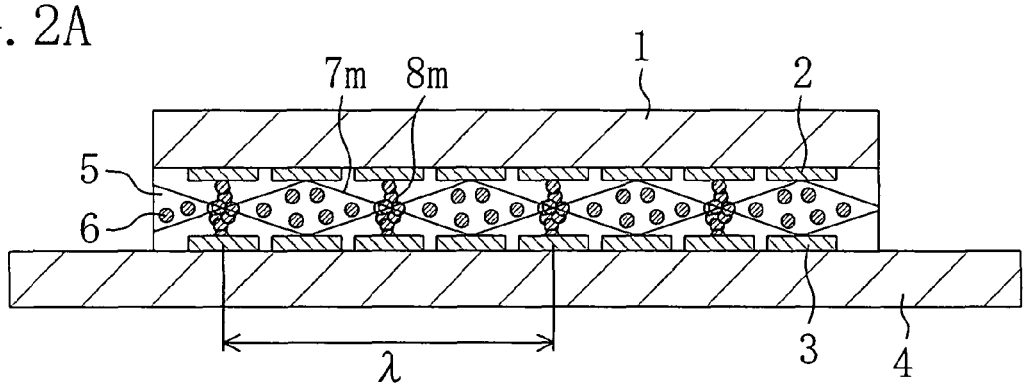
FIGS. 2A through 2C are cross-sectional views illustrating respective steps for generating a standing wave according to the first embodiment of the present invention.
Figure 2B:
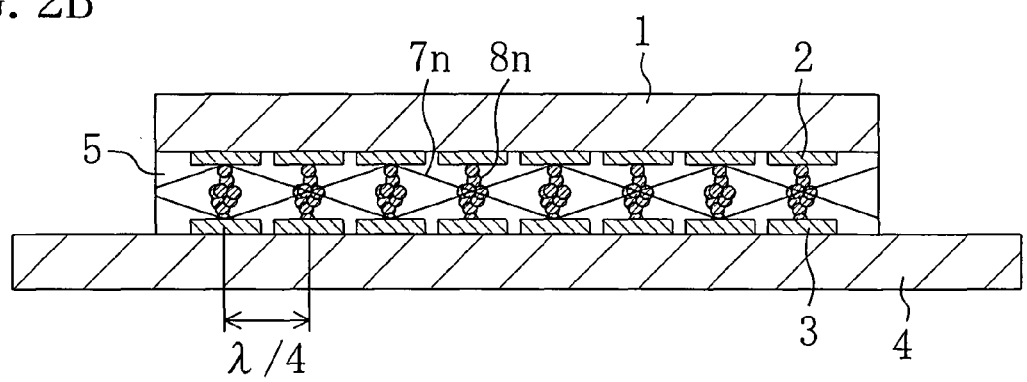
Figure 2C:
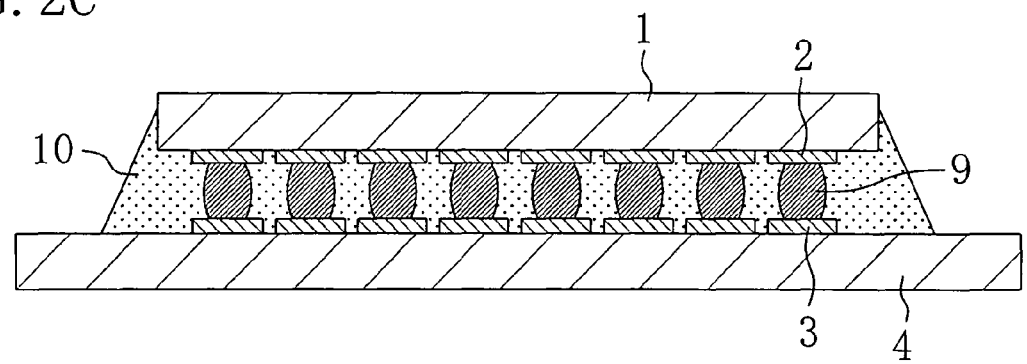

For example, as shown in FIGS. 2A through 2C, the electrode pads 2 and the electrode terminals 3 can be connected via the connection bodies 9, respectively, by two separate incidences of ultrasonic waves. Specifically, as shown in FIG. 2A, a standing wave $7m$ is generated by first incidence of an ultrasonic wave, so that the conductive particles 6 dispersed in the liquid material 5 are aggregated on every second ones of the connection terminals 2 and the electrode terminals 3 to form connection bodies $8m$. In this case, the electrode pads 2 and the electrode terminals 3 are arrayed to be spaced apart from one another at intervals of $\frac{1}{4}\lambda$ with respect to a wavelength $\lambda$ of a standing wave generated by the first incidence of an ultrasonic wave.

Next, as shown in FIG. 2B, a standing wave $7n$ is generated by incidence of an ultrasonic wave of which a phase is shifted by $\frac{1}{4}\lambda$ from a phase of the first ultrasonic wave incident. Thus, the conductive particles 6 dispersed in the liquid material 5 are aggregated on ones of the connection terminals 2 and the electrode terminals 3 which are located adjacent to the ones on which the conductive particles 6 have been aggregated by the first ultrasonic wave incidence. Thus, connection bodies $8n$ are formed. Since each of the connection bodies $8m$ formed by the first ultrasonic wave incidence is located at a loop of the standing wave $7n$ generated by the second ultrasonic wave incidence, the connection bodies $8m$ are hardly influenced by the second ultrasonic wave incidence (even if the connection bodies $8m$ are influenced, the influence is substantially harmless) and can be stayed at locations where they have been formed.

Finally, as shown in FIG. 2C, the conductive particles 6 aggregated at each of the electrode pads 2 and the electrode terminals 3 are fused by heating the liquid material 5 at high temperature to connect the electrode pads 2 of the semiconductor chip 1 and the electrode terminals 3 of the circuit substrate 4 via connection bodies 9, respectively. Thus, electronic component mounted bodies are formed.

In this embodiment, instead of flux used as the liquid material 5, a resin material such as curable resin or thermoplastic resin having the characteristic of hardening may be selected to add the function of the encapsulant resin 10 to the liquid material 5.

Moreover, when a resin material having the characteristic of hardening is selected as the liquid material 5, some other material than solder powder can be used as the conductive particles 6. Hereafter, the description will be given with reference to cross-sectional views of FIGS. 3A through 3D illustrating respective steps.

Figure 3A:
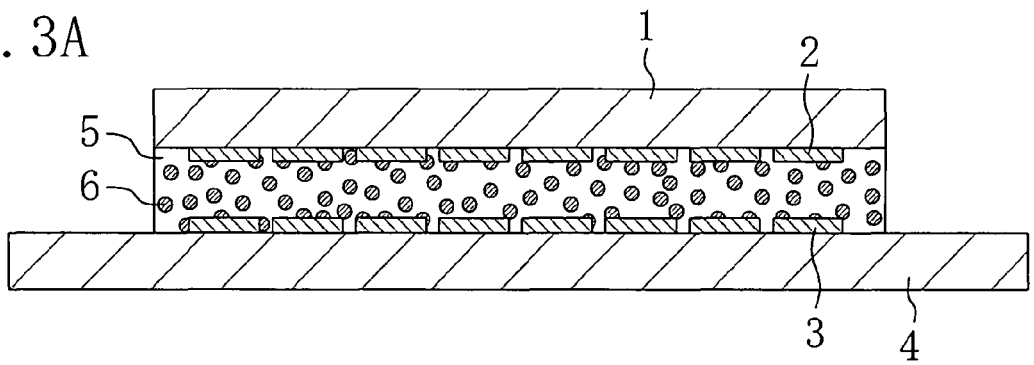
FIGS. 3A through 3D are cross-sectional views schematically illustrating respective steps for connecting electronic components according to the first embodiment of the present invention.

First, as shown in FIG. 3A, a semiconductor chip 1 and a circuit substrate 4 are held in parallel so that the semiconductor chip 1 and the circuit substrate 4 are spaced apart from each other and electrode pads 2 formed on the semiconductor chip 1 and input/output terminals 3 formed on the circuit substrate 4 overlap, respectively, and a liquid material (for example, epoxy-base thermoset liquid resin) 5 containing conductive particles (for example, Cu powder) 6 and having the characteristic of hardening is filled between the semiconductor chip 1 and the circuit substrate 4.

Figure 3B:
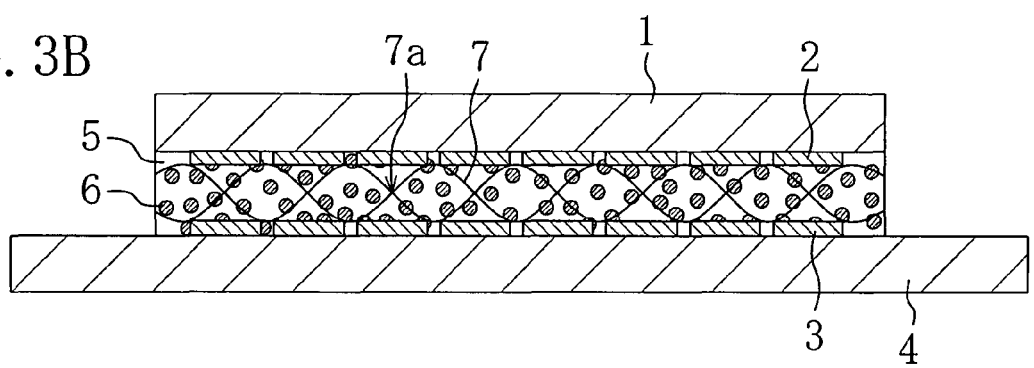
Figure 3C:
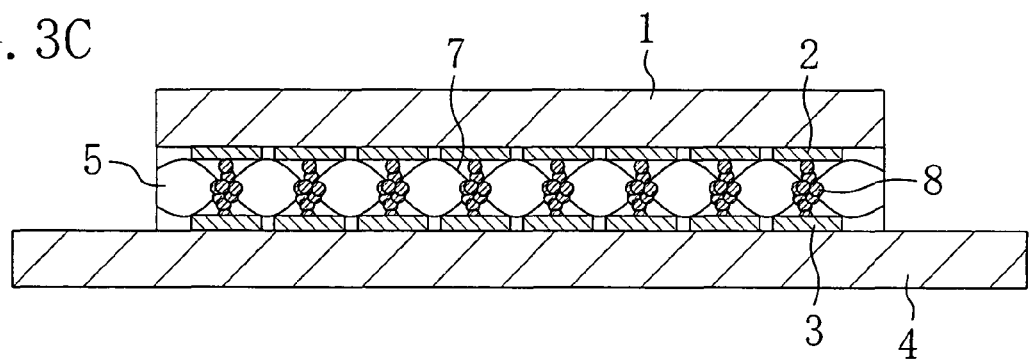

Next, as shown in FIG. 3B, a standing wave 7 is generated in the liquid material 5 so that its amplitude direction is perpendicular and its wave direction is parallel with respect to the semiconductor chip 1 and the circuit substrate 4. Accordingly, as shown in FIG. 3C, the Cu powder 6 are aggregated at nodes $7a$ of the standing wave 7 to form connection bodies 8.

Figure 3D:
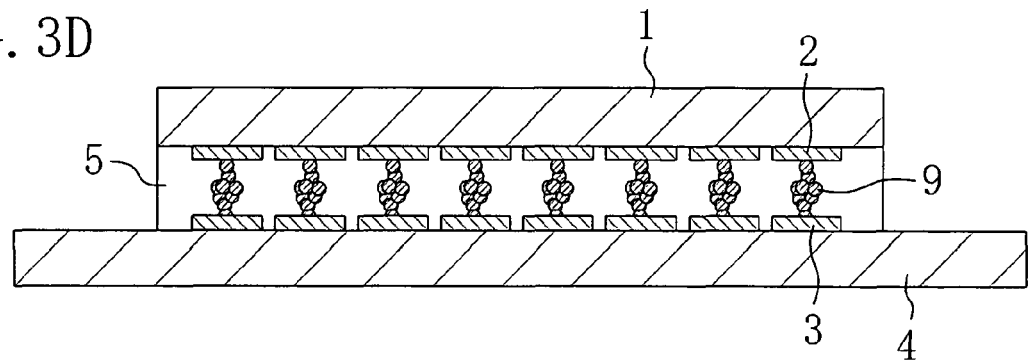

Furthermore, as shown in FIG. 3D, the liquid material 5 is heated at about 150° C., so that the liquid material 5 which is epoxy-base thermoset resin is hardened while the above-described structure of the connection bodies 8 is held. Thus, an electronic component mounted body in which the electrode pads 2 of the semiconductor chip 1 and the electrode terminals 3 of the circuit substrate 4 are connected via the connection bodies 8, respectively, can be formed.

According to this embodiment, an ultrasonic wave is entered into the liquid material 5 in which the conductive particles 6 are dispersed to generate a standing wave. Thus, the connection bodies 8 and 9 each including the aggregated (or aggregated and then fused) conductive particles 6 between the terminals of the semiconductor chip 1 and the circuit substrate 4 can be formed in a batch manner. Therefore, connection between terminals of the circuit substrate 4 of the semiconductor chip 1 can be achieved in a simple manner, so that an electronic component mounted body (semiconductor chip mounted body) with high productivity and at low costs can be realized.

Second Embodiment

FIGS. 4A through 4E are cross-sectional views schematically illustrating respective steps for forming bumps according to a second embodiment of the present invention. In this embodiment, an example where a semiconductor chip is used as a substrate and bumps are formed on terminals of the semiconductor chip, respectively, will be described.

Figure 4A:
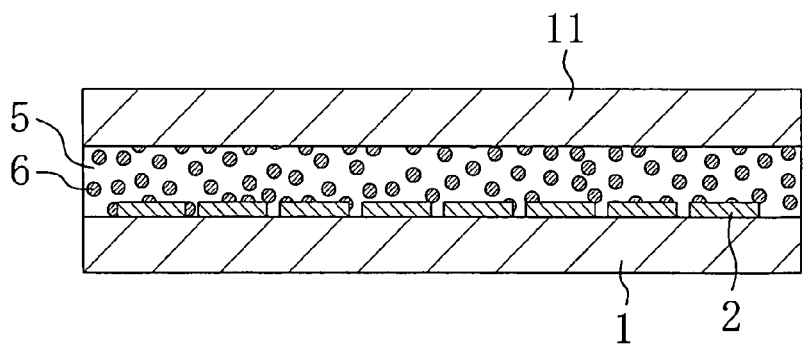
FIGS. 4A through 4E are cross-sectional views schematically illustrating respective steps for forming bumps according to a second embodiment of the present invention.

First, as shown in FIG. 4A, a flat plate 11 is held above the electrode pads (terminals) 2 formed on a semiconductor chip 1 in parallel so as to be apart from the electrode pads, and then a liquid material (for example, flux) 5 containing conductive particles (for example, solder powder) 6 is filled between the semiconductor chip 1 and the flat plate 11.

Figure 4B:
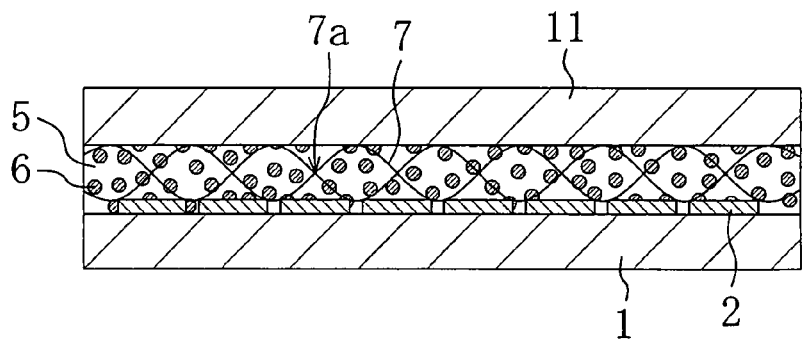
Figure 4C:
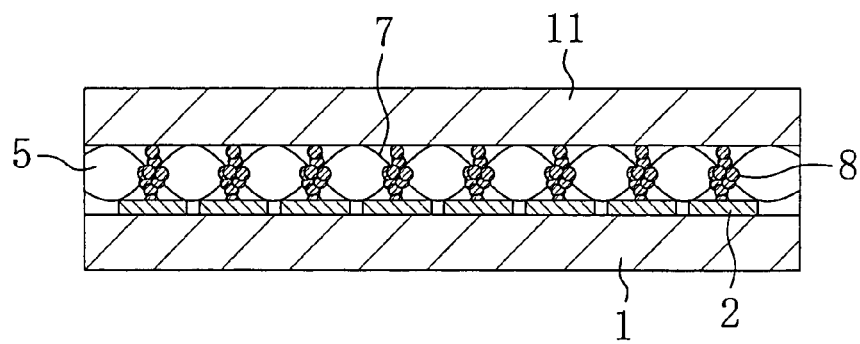

Next, as shown in FIG. 4B, an ultrasonic wave is entered into the liquid material 5 to generate a standing wave 7 so that its amplitude direction is perpendicular and its wave direction is parallel with respect to the semiconductor chip 1 and the flat plate 11. Accordingly, as shown in FIG. 4C, the conductive particles 6 are aggregated at nodes 7a of the standing wave 7 to form connection bodies 8.

Figure 4D:
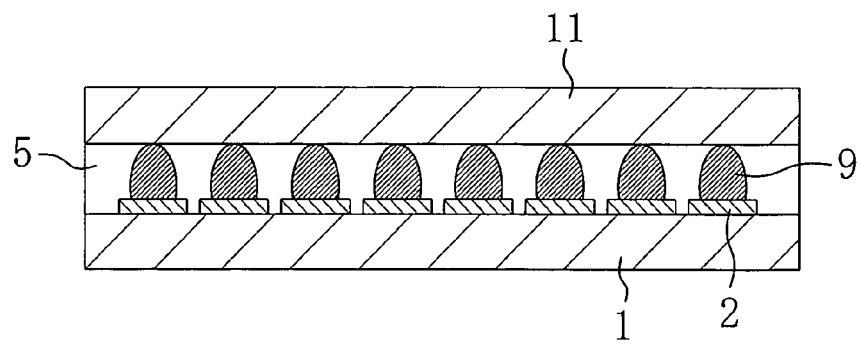
Figure 4E:
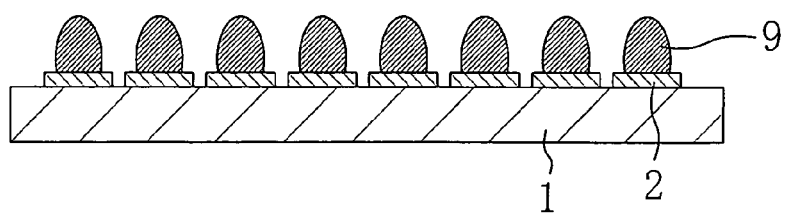

Next, as shown in FIG. 4D, the liquid material 5 is heated at high temperature, so that the connection bodies 8 aggregated at the nodes 7a are fused to form bumps 9 on the electrode pads 2 of the semiconductor chip 1, respectively. Thereafter, as shown in FIG. 4E, the flat plate 11 is removed to complete the semiconductor chip 1 including the bumps 9 on the electrode pads 2.

Figure 5:
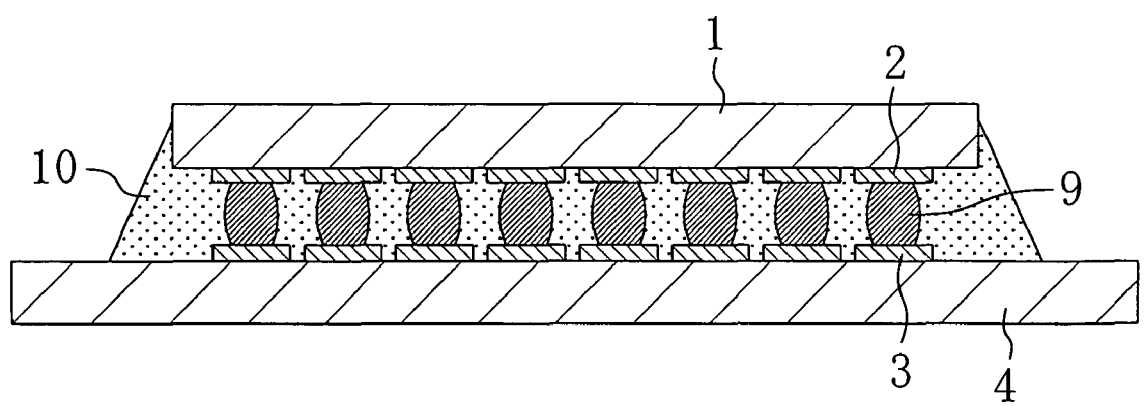
FIG. 5 is a cross-sectional view illustrating a structure of a semiconductor chip mounted body in which a semiconductor chip including bumps is mounted on a circuit substrate according to the second embodiment of the present invention.

As shown in FIG. 5, by mounting the semiconductor chip 1 including the bumps 9 on a circuit substrate 4 using a known flip-chip mounting method, a semiconductor chip mounted body can be formed. An encapsulant resin 10 is injected between the semiconductor chip 1 and the circuit substrate 4, thereby reinforcing fixing of the semiconductor chip 1.

In this embodiment, instead of flux, a resin material such as curable resin or thermoplastic resin having the characteristic of hardening may be selected as the liquid material 5 to add the function of the encapsulant resin 10 to the liquid material 5.

Moreover, when a resin material having the characteristic of hardening is selected as the liquid material 5, some other material than solder powder can be used as the conductive particles 6. Hereafter, the description will be given with reference to cross-sectional views of FIGS. 6A through 6E illustrating respective steps.

Figure 6A:
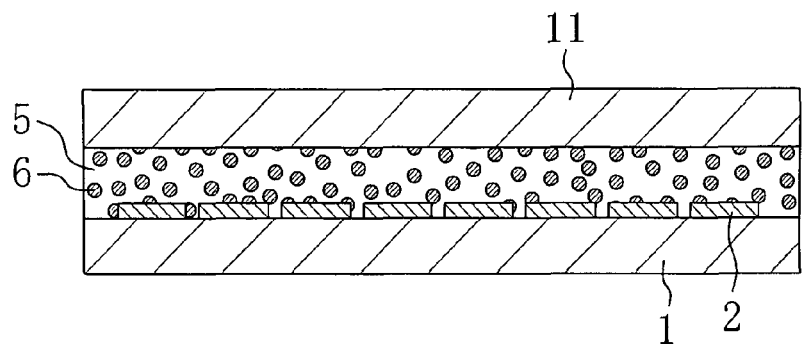
FIGS. 6A through 6E are cross-sectional views schematically illustrating respective steps for forming bumps according to the second embodiment of the present invention.

First, as shown in FIG. 6A, a flat plate 11 is held above electrode pads 2 formed on a semiconductor chip 1 in parallel so as to be apart from the electrode pads, and then a liquid material (for example, epoxy-base thermoset liquid resin) 5 containing conductive particles (for example, solder powder) 6 is filled between the semiconductor chip 1 and the flat plate 11.

Figure 6B:
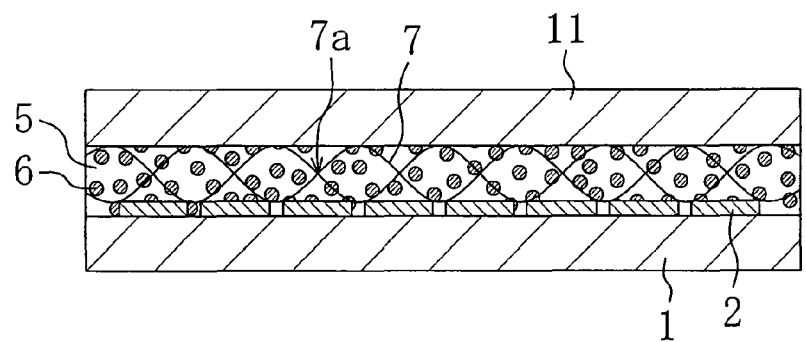
Figure 6C:
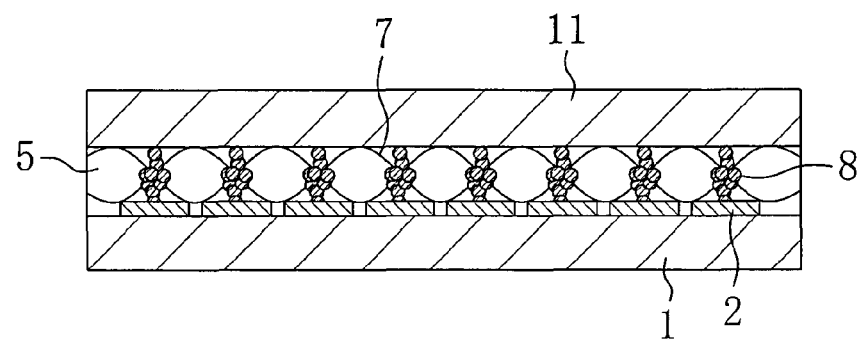

Next, as shown in FIG. 6B, an ultrasonic wave is entered into the liquid material 5 to generate a standing wave 7 so that its amplitude direction is perpendicular and its wave direction is parallel with respect to the semiconductor chip 1 and the flat plate 11. Accordingly, as shown in FIG. 6C, the conductive particles 6 which is Cu powder are aggregated at nodes 7a of the standing wave 7 to form connection bodies 8.

Figure 6D:
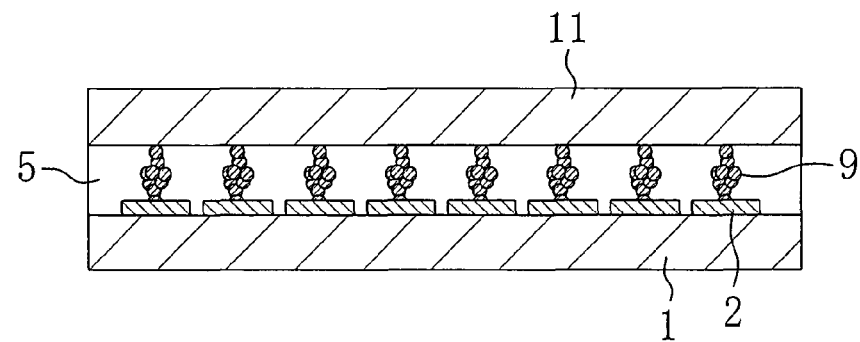
Figure 6E:
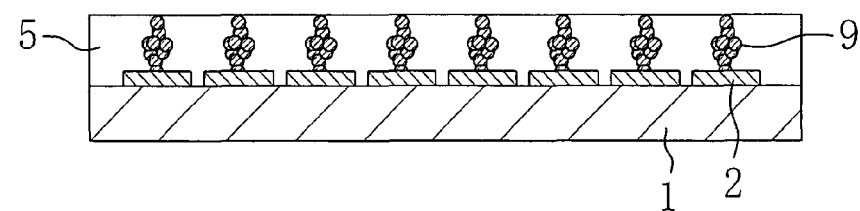

Next, as shown in FIG. 6D, the liquid material 5 is heated at about 150° C., so that the liquid material 5 which is epoxy-base-thermoset resin is hardened. Accordingly, the structure in which the connection bodies 8 of Cu powder are arranged on the electrode pads 2 is fixed, thereby forming bumps 9. Thereafter, as shown in FIG. 6E, the flat plate 11 is removed to complete the semiconductor chip 1 including bumps 9 on the electrode pads 2.

Figure 7:
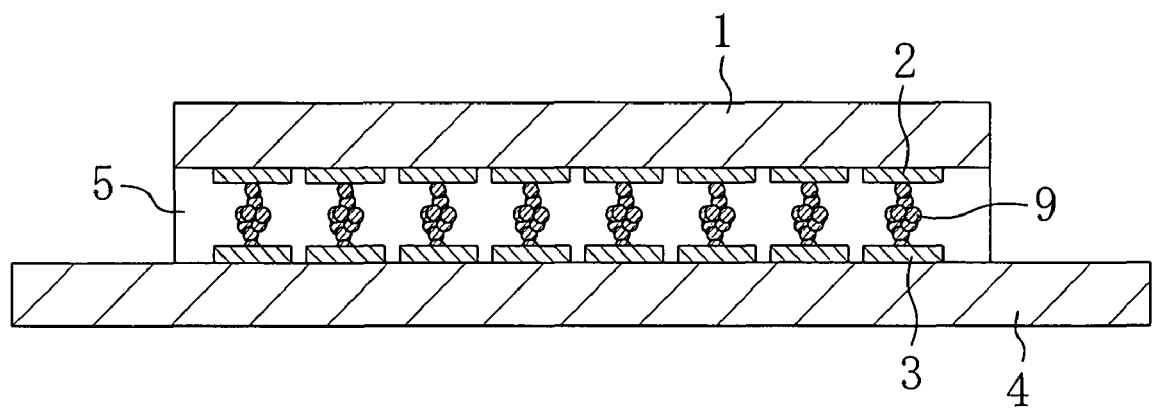
FIG. 7 is a cross-sectional view illustrating a structure of a semiconductor chip mounted body in which a semiconductor chip including bumps is mounted on a circuit substrate according to the second embodiment of the present invention.

As shown in FIG. 7, by mounting the semiconductor chip 1 including the bumps 9 on a circuit substrate 4, a semiconductor chip mounted body can be formed. In mounting the semiconductor chip 1 on the circuit substrate 4, another adhesive (not shown) is used for bonding the hardened liquid material 5 and the circuit substrate 4 to each other. In the process step of FIG. 6D, if hardening of epoxy-base thermoset resin is in a B-stage state (i.e., a state exhibiting adhesiveness), an adhesive is not needed in mounting the circuit substrate 4.

According to this embodiment, an ultrasonic wave is entered into the liquid material 5 in which the conductive particles 6 are dispersed to generate a standing wave. Thus, the connection bodies 8 and 9 each including the aggregated (or aggregated and then fused) conductive particles 6 on the electrode pads 2 of the semiconductor chip 1 can be formed in a batch manner. Therefore, the bumps 8 and 9 can be achieved on the electrode pads 2 of the semiconductor chip 1 in a simple manner, so that a semiconductor chip including bumps with high productivity and at low costs can be realized.

Third Embodiment

FIGS. 8A through 8E are cross-sectional views schematically illustrating respective steps for forming a conductive connection film (connector sheet) according to a third embodiment of the present invention. The conductive connection film is used for connecting electronic components having a plurality of terminals. For example, terminals of a semiconductor chip and terminals of a circuit substrate can be connected via conductive connection film, thereby obtaining a semiconductor chip mounted body.

Figure 8A:
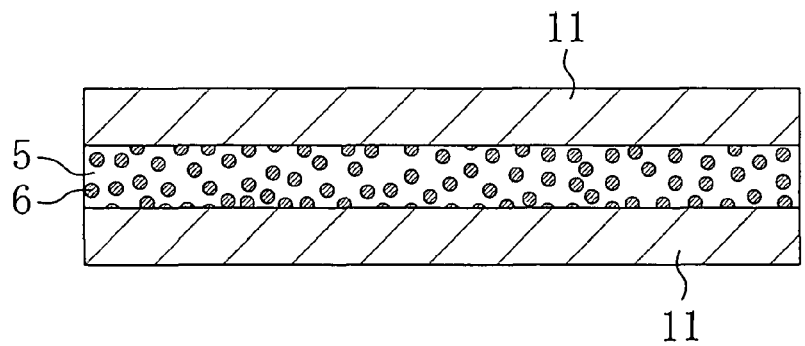
FIGS. 8A through 8E are cross-sectional views schematically illustrating respective steps for forming a conductive connection film according to a third embodiment of the present invention.

First, as shown in FIG. 8A, two flat plates 11 are held in parallel to be separated from each other, and then a liquid material (for example, epoxy-base thermoset liquid resin) 5 containing conductive particles (for example, Cu powder) 6 and having the characteristic of hardening is filled between the flat plates 11.

Figure 8B:
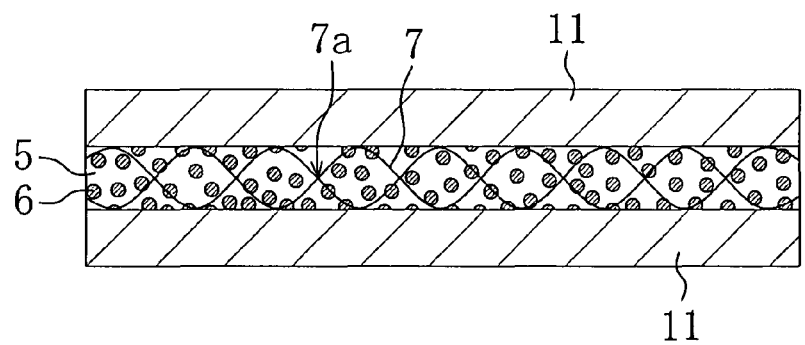
Figure 8C:
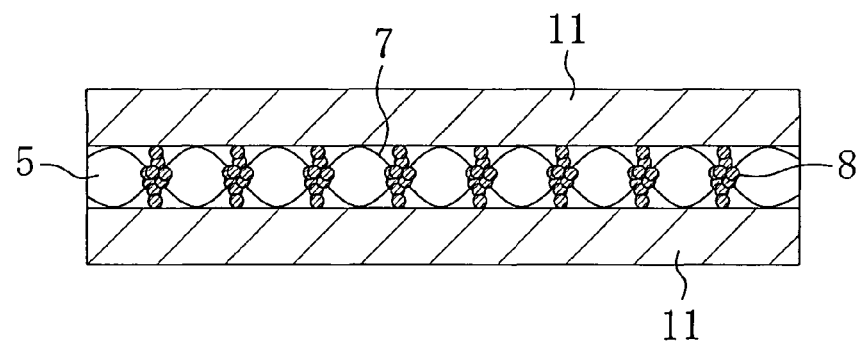

Next, as shown in FIG. 8B, an ultrasonic wave is entered into the liquid material 5 to generate a standing wave 7 so that its amplitude direction is perpendicular and its wave direction is parallel with respect to the flat plates 11. Accordingly, as shown in FIG. 8C, the conductive particles 6 which is Cu powder are aggregated at nodes 7a of the standing wave 7 to form connection bodies 8.

Figure 8D:
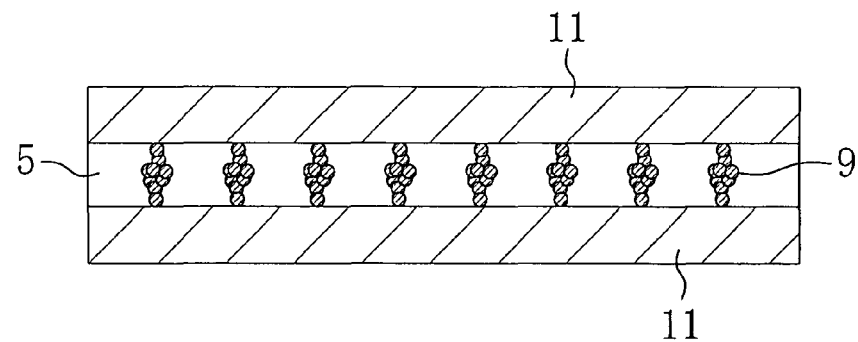
Figure 8E:
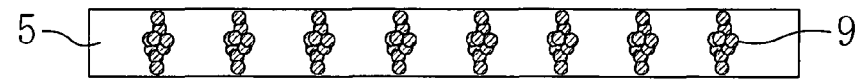

Next, as shown in FIG. 8D, the liquid material 5 is heated at about 150° C., so that the liquid material 5 which is epoxy-base-thermoset resin hardens. Accordingly, a plurality of conductive members (Cu posts) 9 are formed of the connection bodies 8 of Cu powder in a resin film. Thereafter, as shown in FIG. 8E, the flat plates 11 are removed to complete the conductive connection film including a plurality of Cu posts 9 passing through the resin film.

Figure 9:
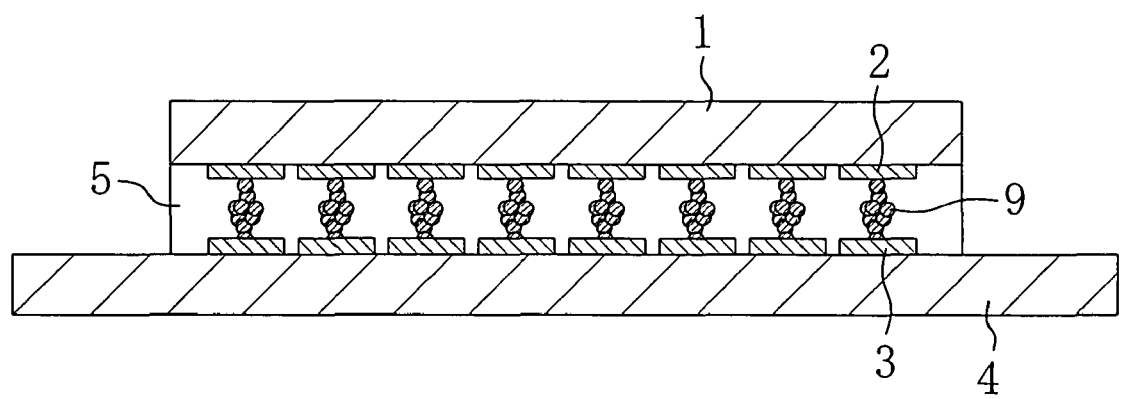
FIG. 9 is a cross-sectional view illustrating a structure of a semiconductor chip mounted body in which a semiconductor chip including a conductive connection film of is mounted on a circuit substrate according the third embodiment of the present invention.

The conductive connection film including the plurality of Cu posts 9 is used for connecting the semiconductor chip 1 and the circuit substrate 4. As shown in FIG. 9, the semiconductor chip 1 and the circuit substrate 4 are connected via the conductive film, so that the electrode pads 2 of the semiconductor chip 1 and the input terminals 3 of the circuit substrate 4 are electrically connected through the Cu posts 9 passing through the conductive connection film, respectively. Thus, a semiconductor chip mounted body is formed.

In forming the semiconductor chip mounted body, the resin film, the semiconductor chip 1 and the circuit substrate 4 are bonded using another adhesive (not shown) but in the process step of FIG. 8D, if hardening of epoxy-base thermoset resin is in a B-stage state, an adhesive is not needed.

According to this embodiment, an ultrasonic wave is entered into the liquid material 5 in which the conductive particles 6 are dispersed to generate a standing wave. Thus, the Cu posts 9 each including the aggregated conductive particles 6 in the resin film can be formed in a batch manner. Therefore, a conductive connection film including Cu posts with high productivity and at low cost can be achieved. Moreover, by applying the conductive connection film to connection (semiconductor chip mounting) for electronic components, low cost electronic component connection body (semiconductor chip mounted body) can be provided.

Fourth Embodiment

Figure 10A:
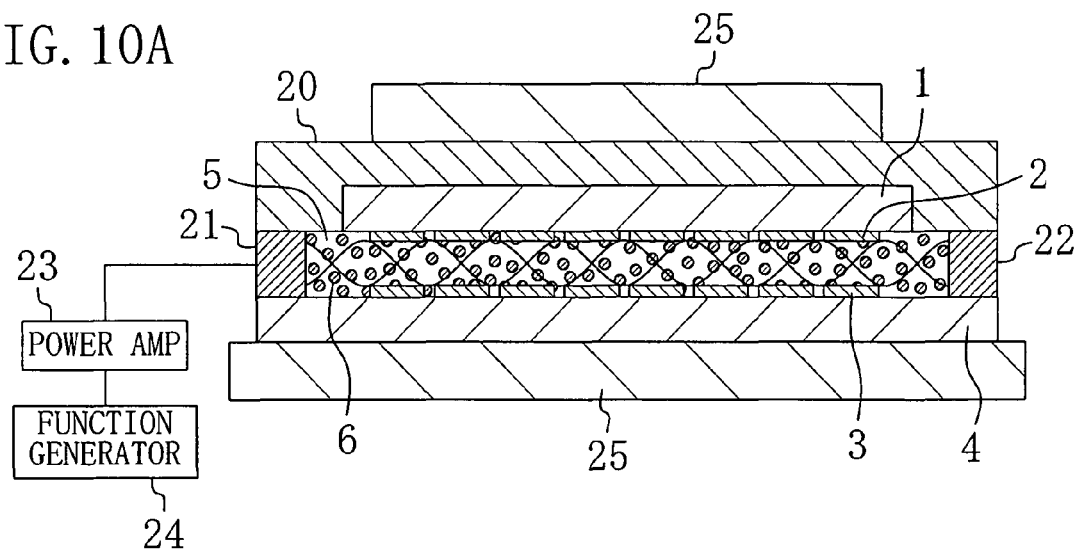
FIGS. 10A through 10C are schematic views illustrating respective structures of fabrication apparatuses for forming an electronic component mounted body, bumps and a conductor film, respectively, according to a fourth embodiment of the present invention.
Figure 10B:
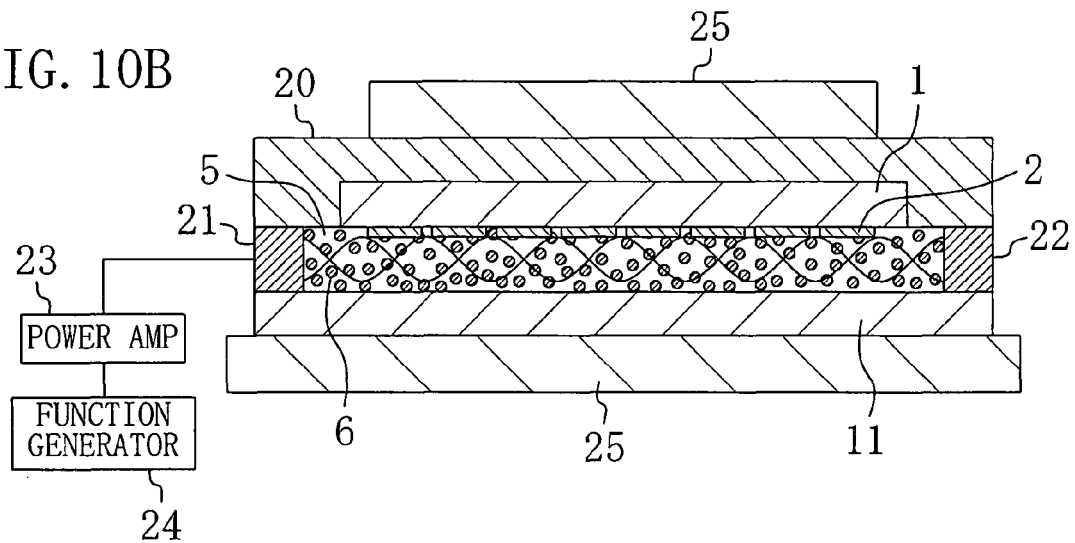
Figure 10C:
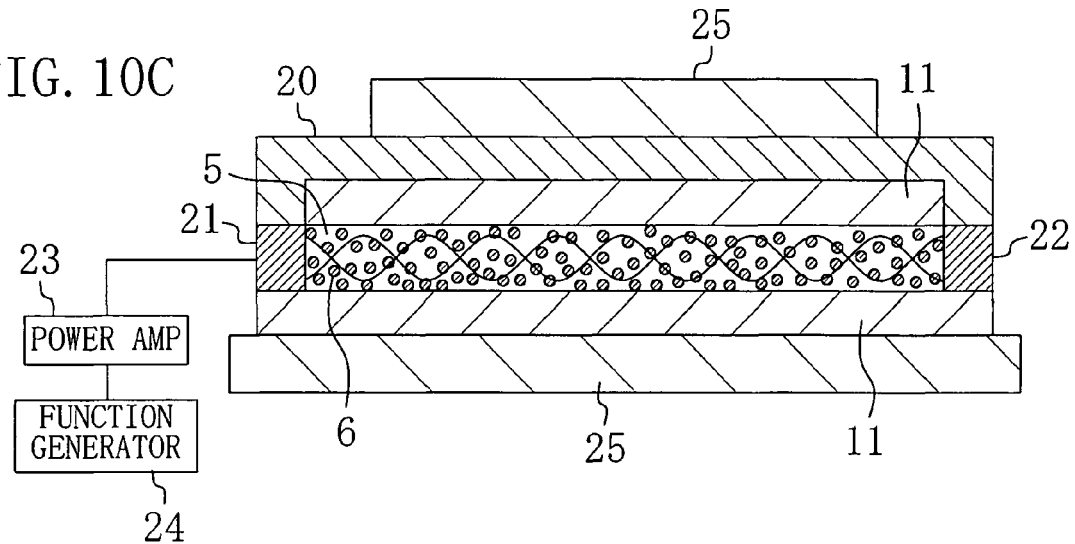
Figure 11A:
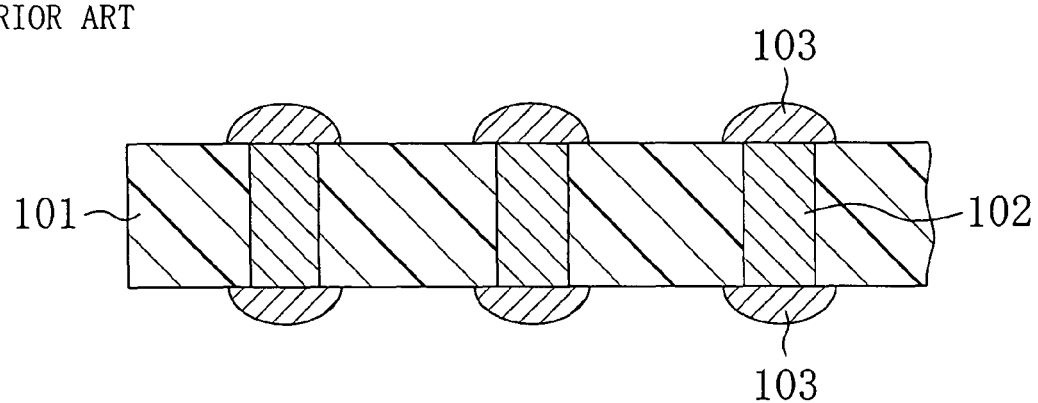
FIGS. 11A and 11B are cross-sectional views illustrating respective steps for mounting a semiconductor chip on a circuit substrate according to a known technique.
Figure 11B:
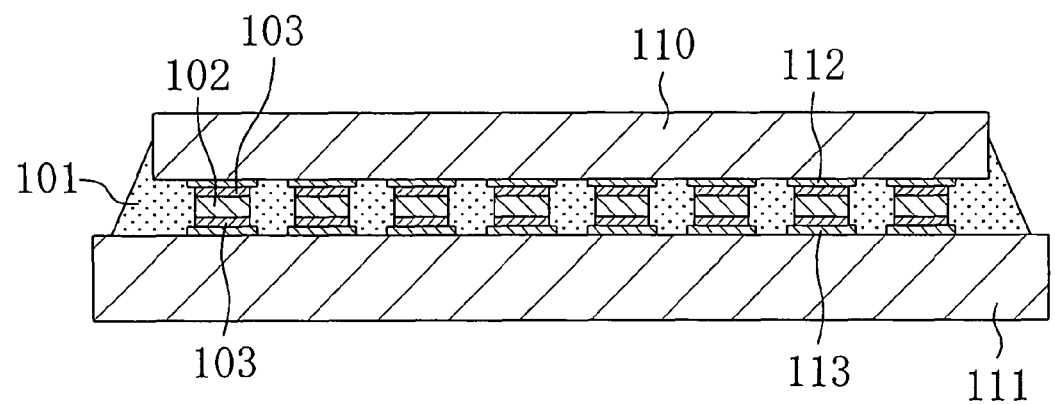

FIGS. 10A through 10C are schematic views illustrating respective structures of fabrication apparatuses for forming an electronic component mounted body, bumps and a conductor film, respectively, according to the method of the first through third embodiments. FIG. 10A illustrates a fabrication apparatus for forming an electronic component mounted body in which electronic components each including a plurality of terminals are connected via connection bodies by the connection method for connecting electronic components according to the first embodiment. FIG. 10B illustrates a fabrication apparatus for forming bumps on terminals of a substrate including a plurality of terminals by a method for forming bumps according to the second embodiment. FIG. 10C illustrates a fabrication apparatus for forming a conductive connection film including a plurality of conductive members passing through a resin film by a method for forming a conductive connection film according to the third embodiment. The fabrication apparatuses have a common basic structure and therefore the basic structure will be hereafter described with reference to FIG. 10A and the description of FIG. 10B and FIG. 10C will be omitted.

As shown in FIG. 10A, electronic components (i.e., a semiconductor chip 1 and a circuit substrate 4 in this case) are disposed so as to face each other and held by holding means 20. The semiconductor chip 1 is buried in a groove portion formed in a surface of the holding means 20 and, furthermore, a vibrating plate 21 for irradiating an ultrasonic wave and a reflecting plate 22 for reflecting an ultrasonic wave are provided at both end portions of the holding means 20, respectively. Thus, a certain space is provided between the semiconductor chip 1 and the circuit substrate 4 and a liquid material 5 in which conductive particles 6 are dispersed is supplied thereto.

A power amplifier 23 and a function generator 24 are connected to the vibrating plate 21 to apply predetermined frequency and voltage to the vibrating plate 21 and an ultrasonic wave having an amplitude in the perpendicular direction to the semiconductor chip 1 and the circuit substrate 4 surface is entered. Thus, a standing wave is generated in the liquid material 5. The conductive particles 6 dispersed in the liquid material 5 are captured by nodes of the standing wave, so that the conductive particles 6 are aggregated between electrode pads 2 of the semiconductor chip 1 and input/output terminals 3 of the circuit substrate 4, respectively. Thus, an electronic component mounting body (flip-chip mounted body) in which electronic components are connected via connection bodies of the conductive particles 6 are formed.

In the holding means 20, heating means 25 such as a heater and the like is provided. Thus, the conductive particles 6 aggregated between the terminals 2 and 4 of electronic components can be fused. Furthermore, the liquid material 5 supplied to between the electronic components 1 and 4 can be thermally hardened.

The present invention has been described by providing preferred embodiments. However, the present invention is not limited to the above-described embodiments and various modifications are possible. For example, in this embodiment, electronic components are assumed to be a semiconductor chip and a circuit substrate. However, electronic components may be, for example, a chip component, a semiconductor wafer, a connector and some other component may be applied.

What is claimed is:

1. A method for connecting electronic components, in which electronic components each having a plurality of terminals are disposed so as to face each other to create electrical connection between ones of the terminals facing each other via an associated one of connection bodies, the method comprising the steps of:
supplying a liquid material in which conductive particles are dispersed to between the electronic components disposed to face each other; and
entering an ultrasonic wave having an amplitude in a perpendicular direction to surfaces of the electronic components to generate a standing wave in the liquid material, thereby capturing the conductive particles dispersed in the liquid material at nodes of the standing wave generated in the liquid material to cause aggregation of the conductive particles between the terminals; and
heating the liquid material to fuse the aggregated conductive particles between the terminals, thereby forming the connection bodies between the terminals.

2. The method of claim 1, wherein each of the nodes of the standing wave is generated in a position between ones of the terminals facing each other in the liquid material.

3. The method of claim 2, wherein the plurality of terminals formed on the electronic components are arrayed so as to be spaced apart from one another by half a wavelength of the standing wave.

4. The method of claim 2, wherein the plurality of terminals formed on the electronic components are arrayed to be spaced apart from one another by ¼ of a wavelength of the standing wave, and
the step of entering the ultrasonic wave to generate the standing wave includes two separate incidences of ultrasonic waves having different phases from each other by ¼ of a wavelength of the standing wave.

5. The method of claim 1, further comprising the step of hardening the liquid material after formation of the connection bodies between the terminals.

6. The method of claim 5, wherein the liquid material is formed of thermoset resin.

7. The method of claim 1, wherein the conductive particles are formed of solder powder.

8. The method of claim 1, wherein the step of supplying the liquid material includes the sub-steps of:
supplying the liquid material in which the conductive particles are dispersed onto one of the electronic components each including the plurality of terminals; and
making the other of the electronic components each including the plurality of terminals abut to a surface of the liquid material so that the other of the electronic components faces said one of the electronic components.

9. The method of claim 1, wherein each of the electronic components is a circuit substrate or a semiconductor chip.

10. A method for mounting a semiconductor chip, in which a semiconductor chip including a plurality of connection terminals is disposed so as to face a circuit substrate including a plurality of electrode terminals and the connection terminals are connected to the electrode terminals via connection bodies, respectively, the method comprising the steps of:
supplying a resin in which conductive particles are dispersed to between the circuit substrate and the semiconductor chip disposed to face each other; and
entering an ultrasonic wave having an amplitude in a perpendicular direction to respective surfaces of the circuit substrate and the semiconductor chip to generate a standing wave in the resin, thereby capturing the conductive particles dispersed in the resin at nodes of the standing wave generated in the resin to cause aggregation of the conductive particles between the electrode terminals and the connection terminals;

heating the resin to fuse the aggregated conductive particles between the electrode terminals and the connection terminals, thereby forming connection bodies; and hardening the resin after formation of the connection bodies.

11. The method of claim 10, wherein each of the nodes of the standing wave is generated in a position between each of the electrode terminals and an associated one of the connection terminals facing each other in the liquid material.

12. The method of claim 11, wherein the electrode terminals and the connection terminals are arrayed so as to be spaced apart from one another by half a wavelength of the standing wave.

13. The method of claim 11, wherein the electrode terminals and the connection terminals are arrayed to be spaced apart from one another by ¼ of a wavelength of the standing wave, and the step of entering the ultrasonic wave to generate the standing wave includes two separate incidences of ultrasonic waves having different phases from each other by ¼ of a wavelength of the standing wave.

14. A method for forming bumps on a plurality of terminals of a substrate, the method comprising the steps of:

supplying a liquid material in which conductive particles are dispersed to between the substrate and a flat plate disposed so as to face the substrate;

entering an ultrasonic wave having an amplitude in a perpendicular direction to respective surfaces of the substrate and the flat plate to generate a standing wave and capture the conductive particles dispersed in the liquid material at nodes of the standing wave, thereby causing aggregation of the conductive particles on the terminals;

heating the liquid material to fuse the aggregated conductive particles on the terminals, thereby forming the bumps; and removing the flat plate after formation of the bumps.

15. The method of claim 14, wherein each of the nodes of the standing wave is generated in a position corresponding to part between associated ones of the terminals in the liquid material.

16. The method of claim 15, wherein the plurality of terminals are arrayed so as to be spaced apart from one another by half a wavelength of the standing wave.

17. The method of claim 15, wherein the plurality of terminals are arrayed to be spaced apart from one another by ¼ of a wavelength of the standing wave, and the step of entering the ultrasonic wave to generate the standing wave includes two separate incidences of ultrasonic waves having different phases from each other by ¼ of a wavelength of the standing wave.

18. The method of claim 14, wherein the liquid material is formed of resin having adhesiveness.

19. A method for forming a conductive connection film which includes a plurality of conductive members each passing through a resin film, the method comprising the steps of:

supplying a liquid resin in which conductive particles are dispersed to between flat plates disposed so as to face each other;

entering an ultrasonic wave having an amplitude in a perpendicular direction to respective surfaces of the flat plates to generate a standing wave and capture the conductive particles dispersed in the liquid resin at nodes of the standing wave, thereby forming the conductive members of aggregation of the conductive particles in the liquid resin;

hardening the liquid resin to form the liquid resin into a resin film; and removing the flat plates after formation of the resin film.

* * * * *